United States Patent
Aita

(10) Patent No.: US 6,392,230 B1
(45) Date of Patent: May 21, 2002

(54) FOCUSED ION BEAM FORMING METHOD

(75) Inventor: Kazuo Aita, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/286,050

(22) Filed: Apr. 5, 1999

(30) Foreign Application Priority Data

Jun. 6, 1998 (JP) .......................................... 10-093078

(51) Int. Cl.$^7$ ....................... H01J 37/244; G01N 23/00; F26B 21/00; F26B 3/00; F26B 19/00
(52) U.S. Cl. ...................... 250/307; 250/307; 250/309; 250/310; 250/492.2
(58) Field of Search ................................. 250/307, 424, 250/492.1, 492.21, 492.22, 492.23

(56) References Cited

U.S. PATENT DOCUMENTS

| | | | | |
|---|---|---|---|---|
| 4,503,329 A | * | 3/1985 | Yamaguchi | 250/309 |
| 5,434,422 A | | 7/1995 | Iwamoto et al. | 250/309 |
| 5,438,197 A | | 8/1995 | Fujii et al. | 250/309 |
| 6,146,135 A | * | 11/2000 | Watanabe | 432/221 |
| 6,172,363 B1 | * | 1/2001 | Shinada | 250/310 |

* cited by examiner

Primary Examiner—Bruce Anderson
Assistant Examiner—A. Quash
(74) Attorney, Agent, or Firm—Adams & Wilks

(57) ABSTRACT

A pattern film forming method comprises the steps of introducing a film forming gas on a sample, scanning a focused ion beam over a preselected area of the sample to form a pattern film on the sample, and reducing the scanning area of the focused ion beam while forming the pattern film on the sample.

7 Claims, 3 Drawing Sheets

FOCUSED ION BEAM FORMING METHOD

BACKGROUND OF THE INVENTION

The present invention relates to a method of forming a pattern film by irradiating a focused ion beam to a predetermined region on a sample while blowing a film forming gas to a sample surface.

The conventional method of forming a pattern film due to focused ion beam irradiation is as follows. A film forming gas (for example, an organic compound gas such as pyrene) is blown locally to a predetermined region of a sample surface to be newly formed with a pattern film. Simultaneously therewith, a focused ion beam is irradiated while repeatedly scanning at the predetermined region. The film forming gas blown to the predetermined region is absorbed to the predetermined region of the sample and its vicinity of the sample surface. The organic compound absorbed at the predetermined region of the sample surface is dissolved by the irradiation of the focused ion beam, forming a carbon film. Because the focused ion beam is repeatedly scanned and irradiated, the carbon film is formed as a pattern film to a desired thickness. This pattern film is used to modify a mask used in semiconductor device manufacturing or to form a pattern (pattern modification) of a semiconductor device itself.

Also, if a metal organic compound gas is used as a film forming gas, a metal pattern is formed for interconnection, while, if a silicon compound gas is used, an insulation film is formed.

Incidentally, these organic compound gas, metal organic compound gas, silicon compound gas, etc. for forming a film due to focused ion beam irradiation are herein called a material gas.

If the repeated scanning of the focused ion beam is at a same number of times, the thickness of a film to be formed by this method varies depending on an area of a formed pattern film. If the area of the pattern film is great, the thickness of the pattern film becomes thick, while, if the area is small, the thickness becomes thin. This is because if the area of pattern film formation is broad, it takes a time for the focused ion beam to completely (one screen) scan over the pattern film forming region. As a result, there is an increase in the amount of a material gas absorbed to the sample surface until irradiated by the next focused ion beam scanning and the thickness of a pattern film to be formed increases. If the area of a pattern to be formed is small, the thickness of a pattern film decreases due to a reversal phenomenon. FIG. 4 shows part of such a situation. FIG. 4 is a graph showing a relationship between the area in which a pattern film is formed and the number of times of ion beam scans required for obtaining a thickness of a certain pattern film. A line 30 represents that the smaller the area the lower the film forming capability is.

Furthermore, if the area is small, etching effects due to focused ion beam irradiation becomes prevalent over formation of a film, resulting in no film formation or conversely cutting the substrate at the focused ion beam irradiating region.

As above, it is impossible to make constant the desired thickness of a film due to the area of a pattern film formed. In order to avoid this, first of all, where the area of a pattern film to be formed is less than a certain constant (for example, approximately 50 square $\mu$m, "a" in FIG. 4a), when a pattern film is formed by focused ion beam irradiation, a time interval is set of focused ion beam irradiation to a same point to cause the material gas to be sufficiently absorbed in the sample surface. That is, an irradiation suspension time is provided for each scanning of the focused ion beam by one screen over the pattern film forming region. The irradiation suspension time is set at same timing as such timing that a position when the film forming region is approximately 50 square $\mu$m is again subjected to irradiation due to focused ion beam repeated scans.

However, when the pattern forming area is extremely small, the pattern film forming speed increases as shown by a line 31 in FIG. 4. This occurs when the width of the pattern forming region decreases almost as small as on the order of the diameter of the focused ion beam. That is, when the repeated scan with the focused ion beam is performed the same number of times to form a film, the thickness of the film increases as the area decreases. Although the cause of this is not known, part of the ion beam irradiated generally consumed by not film formation but in etching. Accordingly, film forming effects improves at a position of fine linewidth in terms of a same amount of material gas deposition.

Next, a relationship is previously determined under such a condition between the number of scans to obtain a given film thickness and the area of a pattern film to be formed, as in FIG. 4. The number of ion beam scans required for film formation is varied in accordance with the desired film area in compliance with the graph shown in FIG. 4.

The above conventional art is effective in the case where the film to be formed does not have both a portion with a broad pattern width and an extremely narrow portion. However, where the film to be formed has both a portion with a broad pattern width and an extremely narrow portion, when forming a film of a square large pattern form 21 having a pattern portion 21a in a projection form small in linewidth similarly on the order to the focused ion beam diameter as in FIG. 1, film forming efficiency increases at the pattern portion 21a in the projection form small in linewidth. The pattern portion 21a in the small projection form partially increases in film thickness, making it difficult to keep the film thickness constant throughout. There arises a problem where the film thickness is not desired to be unnecessarily high or the like.

Generally, the film formed has been partly etched by the focused ion beam. Thin films called halo are formed around the pattern film due to a substance of etching around the formed pattern film or scatter in part of the focused ion beam. As the thickness of the formed pattern film increases, the halo film thickness increases. Particularly in a technique of correcting mask patterns, there arises a problem of exposure because of serving as an ingredient to attenuate light. Assuming the film thickness of the pattern portion with a small linewidth projection form is made to a desired film thickness, the large area pattern portion is thin in thickness and difficult to sufficiently shield light, also raising a problem. Also, this halo problem poses a problem in changing interconnections because of reducing resistance values between neighboring interconnections.

SUMMARY OF THE INVENTION

In order to solve the above-stated problems, the region of ion beam scanning for film formation is decreased in every direction within a plane in a course of film formation.

According to the above method, the ion beam scanning region becomes limited to only a film central portion with a film thickness lower than a film periphery portion for an object to be formed with a film extremely narrow in linewidth. When the initial ion beam scanning region is extremely narrow, the ion beam scanning region itself vanishes, ending the film formation. Due to this, the film thickness can be suppressed from unnecessarily heightening at a fringe. Or, when simultaneously forming a plurality of films different of size, it is possible to suppress only a small film from abnormally heightening in film thickness.

DETAILED DESCRIPTION OF THE PREFERRED EMBODIMENT

Figure 1:
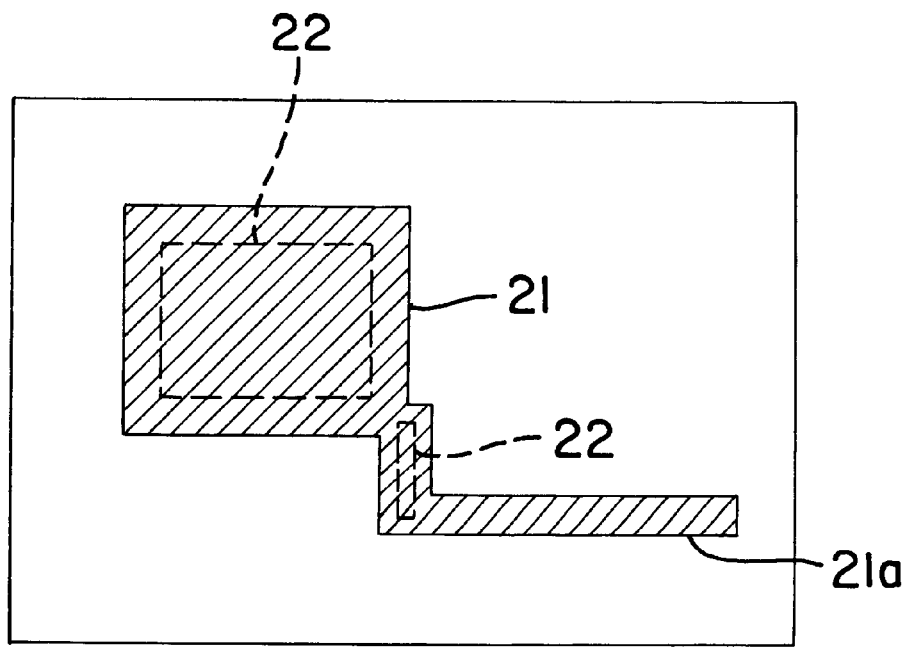
FIG. 1 is a plan view representing a predetermined area on a sample surface for showing an embodiment of the present invention.

The mode of the present invention will be explained with reference to the embodiment shown in the drawings.

Figure 3:
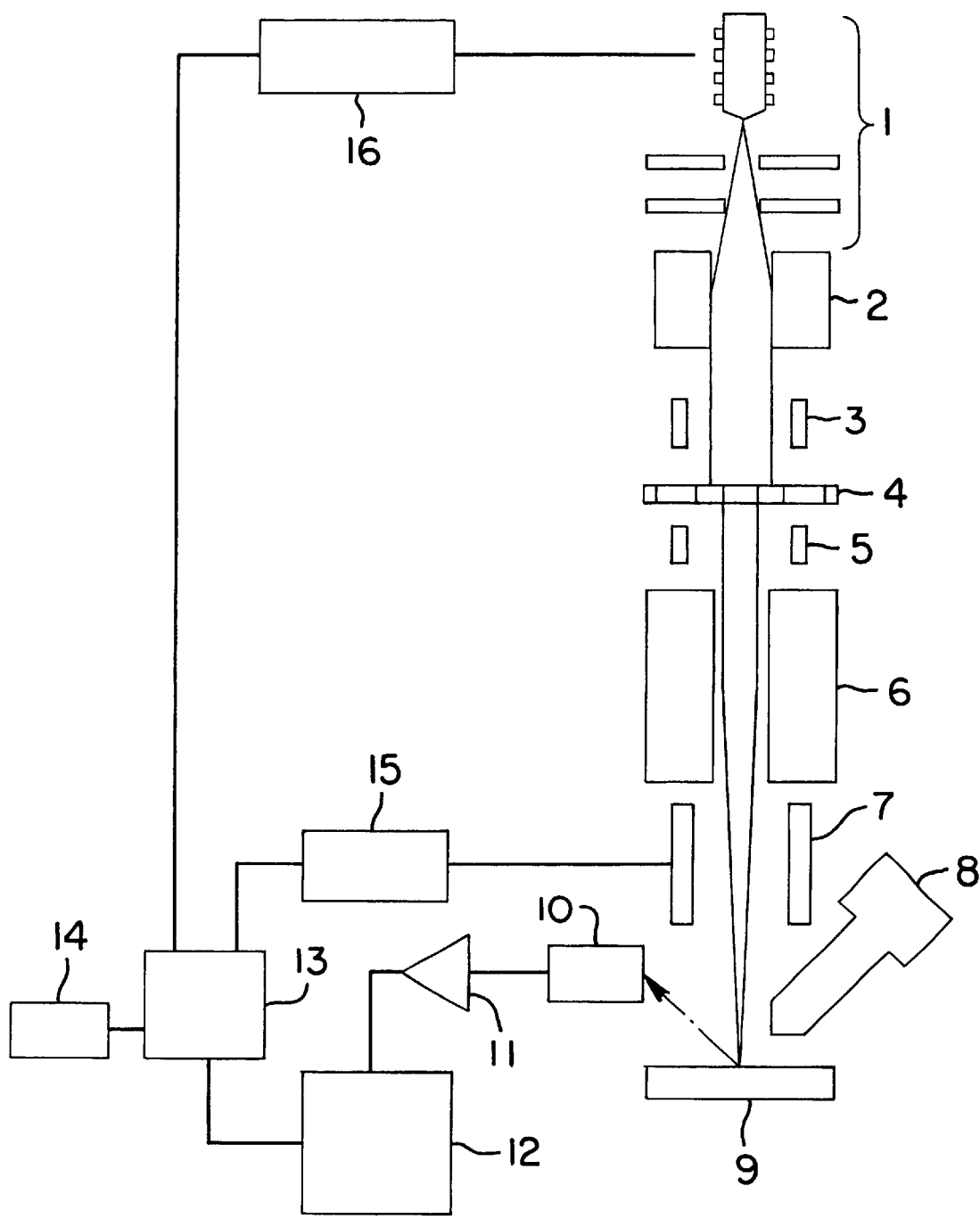
FIG. 3 is a schematic sectional view showing an apparatus of the present invention.
Figure 4:
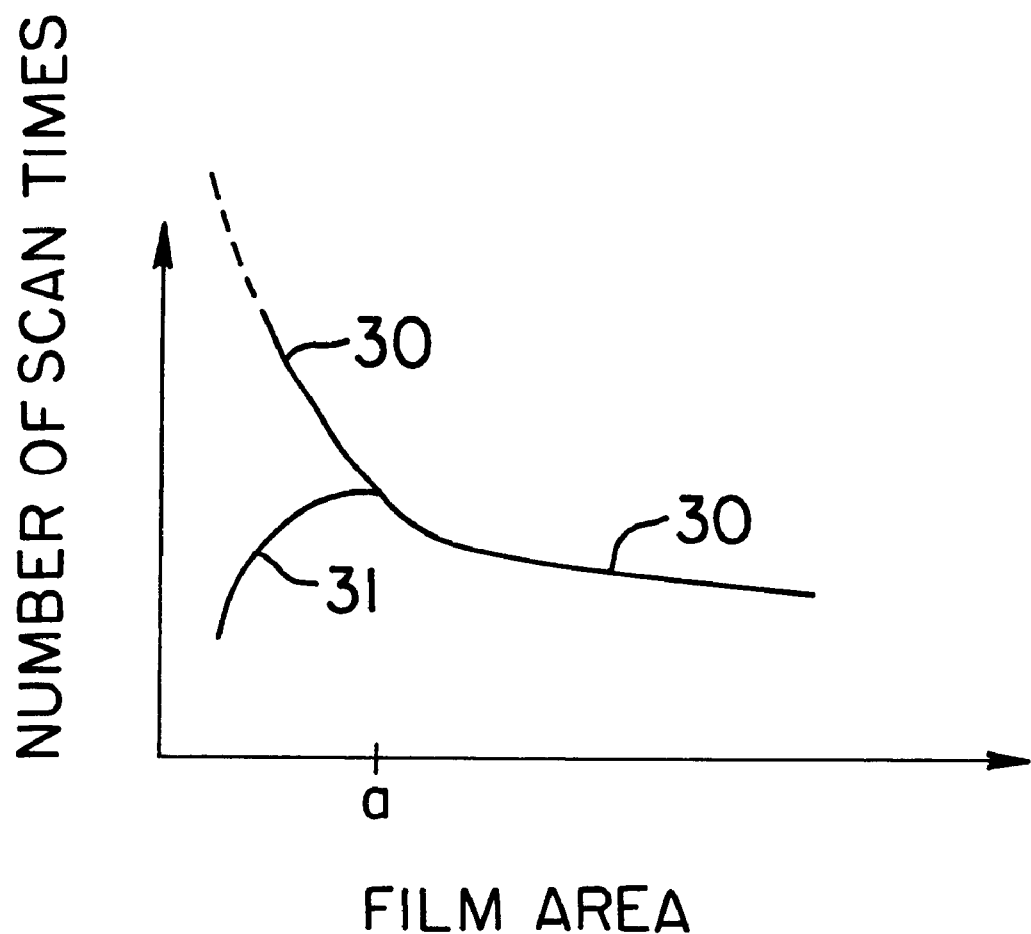
FIG. 4 is a figure showing a relationship between a pattern film area and the number of scan times of the focused ion beam required for obtaining the same thickness.

FIG. 3 is an apparatus to carrying out the present invention. 1 is an ion source to emit an ion beam. For example, a gallium liquid metal ion source is employed. 2 is a capacitor lens for focusing an ion beam generated by an ion beam generating power source, emitted by the ion source and controlled by a control section 16. 3 is an upper deflection plate which causes an ion beam passed through the condenser lens 2 to largely deflect due to application of voltage. This allows ion beam blanking or the like to be performed as required. 4 is a movable reducer that can be moved in a direction perpendicular to an ion beam path.

5 is an astigmatic correction lens, which provides correction for astigmatism of an ion beam passed through the movable reducer 4 and obtain a true circle ion beam spot. 6 is an objective lens for focusing on a sample 9 surface a spot of the ion beam that has been corrected for astigmatism. 7 is a scanning electrode comprising two sets of X and Y electrodes. An ion beam spot is raster scanned over a sample to repair and work a pattern film, for example, of a mask or semiconductor device.

8 is a gas injector to blow, for example, pyrene and hexacarbonyl metal gasses to respective film-forming points (predetermined areas) of a mask and semiconductor device. Simultaneously, irradiation is made while scanning with an ion beam to the film-forming point to dissolve a pyrene gas or hexacarbonyl metal gas absorbed on a surface, thereby forming a pattern film.

By irradiating a focused ion beam, the secondary charged particles emitted from the sample 9 surface are detected by a secondary charged particle detector 10, and amplified and A/D transformed by a signal amplification processing section 11 into a luminance signal. The luminance signal and the scanning signal from a scanning control section 13 are together inputted to a display 12 to display a secondary charged particle picture. With this secondary charged particle picture, search is made on a position and area (predetermined area) to be formed with a pattern film on the sample 9.

The scanning control section 13 is set by the picture displayed on the display 12 such that a focused ion beam is repeatedly scanned at the predetermined area on the determined sample 9 surface. A scanning signal from the scanning control section 13 is inputted to the scanning electrode 7 so that the focused ion beam passed through the scanning electrode 7 undergoes a predetermined deflection. This causes the focused ion beam to be repeatedly scanned over the predetermined area on the sample 9.

Also, the scanning control section 13 is connected with a scan range adjuster 15. The scan range adjuster 15 converts a scanning signal to be inputted to the scanning electrode 7. That is, this is to make a focused ion beam scanning area into a reduced area from the predetermined area during a process of repeated scanning. For example, upper-and-lower signals of main and sub scanning signals are made into a signal cut in a predetermined amount. This, if reworded in respect of the scanning area, is made into an area that is narrowed at both the upper and lower in an x direction and narrowed at both the left and right in a Y direction. Incidentally, this scan range adjuster 15 can be provided in the scanning control section 13. Also, the switching-over of scan range can be freely set by a counter (one that counts the number of focused ion beam scanning) or timer provided in the scan range adjuster 15 or scanning control section 13.

Figure 2:
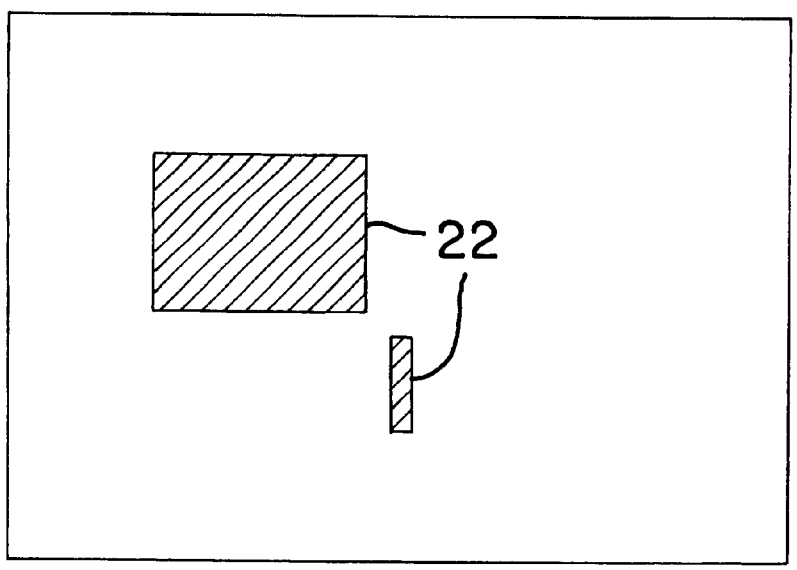
FIG. 2 is a plan view representing a narrower area on the sample surface for showing the embodiment of the present invention.

Next, explanations will be made on FIG. 1 and FIG. 2. In FIG. 1, an area to be formed with a pattern film is shown by a hatched portion. This area is assumed to be a predetermined area 21. First, this predetermined area 21 is blown, for example, by a gas for pyrene from the gas injector 8. Simultaneously, in the scanning section 13, a focused ion beam is irradiated while scanning to the predetermined area 21. After scanning and irradiating a predetermined number of times with the focused ion beam to the predetermined area 21, the scan range is rendered into an area (a reduced area 22) that is reduced of the predetermined area 21 by a predetermined width in the X, Y directions by a scan range adjuster 15. Incidentally, the gas from the gas injector 8 is remained blowing.

The portion surrounded by dotted lines in FIG. 1 is a reduced area 22. FIG. 2 shows the reduced area 22 as the reduced film formed surrounded by the dotted lines in FIG. 1. The timing of reduction is determined at a time point that the film height of a shape 21a in which the film-forming scanning area is lost by reducing grows to a targeted height. This can be switched by determining an empirical height and determining a switching time of scan range so that the time is previously set in a counter or timer provided in the scan range adjuster 15 or scanning control section 13.

The scanning of the focused ion beam is generally scanned with digital dots. The adjacent dots have about 0.01–0.1 $\mu$m although different on the apparatus and magnification ratio. It is preferred that the amount to be reduced in the present invention is 0.01–0.3 $\mu$m.

If less than 0.01 $\mu$m on one side in the XY direction, there occurs overlapping between a fringe thickened portion in a pattern film first formed and a fringe in a pattern film formed with reduction. As a result, the fringe is thickened and also a halo is formed thick.

Also, if 0.3 $\mu$m or greater, the distance between a thickened portion at the fringe of the pattern film first formed and the fringe of the pattern film formed with reduction is broadened, which portion cannot have a predetermined thickness.

Furthermore, there are cases that the film is formed by a method of blanking an ion beam at constant timing for the purpose of sufficiently supplying and absorbing film forming gas when the ion beam is scanned.

As stated above, according to the present invention, when a film to be formed has both a portion wide in pattern width and a portion extremely narrow in pattern width, it is possible to keep wholly constant the thickness of the pattern film. Moreover, it is prevented that the film thickness of a halo component becomes unnecessarily thick. It is possible to form a film with the film thickness kept equivalent irrespective of film width, and with a position of the film formed kept with greater accuracy.

What is claimed is:

1. A focused ion beam forming method, comprising the steps of: generating ions from an ion source to form a focused ion beam by a lens; irradiating the focused ion beam on a surface of a sample while scanning the focused ion beam over a preselected area of the surface of the sample by a scanning electrode; detecting secondary particles emitted from the sample by a detector; A/D converting a signal from the detector; displaying a surface image of the sample on a display unit; setting a predetermined area of the surface of the sample to be formed with a pattern film in accordance with the image displayed on the display unit; forming a pattern film on the surface of the sample by repeatedly scanning the ion beam over the predetermined area of the sample surface while blowing a film forming gas from a gas injector to the predetermined area of the sample surface; and decreasing the area of the sample surface scanned by the focused ion beam during the repeated scanning of the surface of the sample.

2. A pattern film forming method comprising the steps of: directing a film forming gas onto a sample; scanning a focused ion beam over a preselected area of the sample to form a pattern film on the sample; and reducing the scanning area of the focused ion beam while forming the pattern film on the sample.

3. A pattern film forming method according to claim 2; further comprising the step of blanking the focused ion beam at constant timing during scanning of the focused ion beam.

4. A pattern film forming method according to claim 2; wherein the film forming gas is introduced on the sample while simultaneously scanning the focused ion beam over the preselected area of the sample.

5. A method according to claim 2; wherein the film forming gas is introduced on the sample while simultaneously reducing the scanning area of the focused ion beam.

6. A method of forming a pattern film using a focused ion beam, comprising the steps of: generating a focused ion beam; directing a film forming gas onto a sample; and repeatedly scanning the focused ion beam over a preselected area of a surface of the sample while reducing the scanning area of the focused ion beam to form a pattern film on the surface of the sample.

7. A method according to claim 6; further comprising the step of selectively blanking the focused ion beam during scanning of the focused ion beam.

\* \* \* \* \*